United States Patent [19]

Seki et al.

[11] Patent Number: 4,896,200
[45] Date of Patent: Jan. 23, 1990

[54] NOVEL SEMICONDUCTOR-BASED RADIATION DETECTOR

[75] Inventors: Yasukazu Seki; Noritada Sato, both of Yokosuka; Masaya Yabe, Kanagawa, all of Japan

[73] Assignee: Fuji Electric Co., Ltd., Kawasaki, Japan

[21] Appl. No.: 153,520

[22] Filed: Feb. 1, 1988

Related U.S. Application Data

[63] Continuation of Ser. No. 803,115, Nov. 29, 1985, abandoned.

[30] Foreign Application Priority Data

Nov. 30, 1984 [JP] Japan .................................. 59-253684

[51] Int. Cl.⁴ .......................................... H01L 27/14
[52] U.S. Cl. .......................................... 357/30; 357/2
[58] Field of Search ................. 357/2, 16, 30 J, 30 K, 357/30 Q

[56] References Cited

U.S. PATENT DOCUMENTS

| | | | |
|---|---|---|---|
| 4,228,315 | 10/1980 | Napoli | 357/30 J |
| 4,394,676 | 7/1983 | Agouridis | 357/30 Q |
| 4,492,813 | 1/1985 | Kausche et al. | 357/30 Q |
| 4,539,431 | 9/1985 | Moddel et al. | 357/30 J |
| 4,590,327 | 5/1986 | Nath et al. | 357/30 J |
| 4,611,224 | 9/1986 | Seki et al. | 357/2 |
| 4,692,782 | 9/1987 | Seki et al. | 357/2 |

Primary Examiner—Martin H. Edlow
Attorney, Agent, or Firm—Bruce L. Birchard

[57] ABSTRACT

A semiconductor-based radiation detector comprising a semiconductor substrate and an amorphous semiconductor layer formed on one surface of the substrate, one electrode being applied to the substrate and one to the amorphous layer, the electrodes formed on the amorphous semiconductor layer consisting of closely spaced, interconnected conductive strips which are substantially uniformly arranged over the entire radiation-incident surface of the amorphous semiconductor layer whereby the electrostatic capacitance appearing between the electrodes of the detector is significantly reduced without significantly changing the area of the detector that responds to radiation.

6 Claims, 2 Drawing Sheets

NOVEL SEMICONDUCTOR-BASED RADIATION DETECTOR

This application is a continuation of application Ser. No. 06/803,115, filed Nov. 29, 1985, now abandoned.

BACKGROUND OF THE INVENTION

1. Field of the Invention

This invention relates to radiation detectors and, more specifically, to semiconductor-based radiation detectors.

2. Prior Art

There exist radiation detectors comprising a semiconductor substrate which is of a single-crystal material, an amorphous semiconductor layer of large specific resistance formed on one surface of the substrate, a first electrode formed on the amorphous layer, a second electrode formed on the side of the substrate opposite that on which the amorphous layer has been deposited, and a heterojunction formed between the substrate and the amorphous layer, the heterojunction being reversedbiased by applying a voltage between the recited electrodes to thereby produce a depletion layer in the substrate, the depletion layer producing carriers when exposed to radiation. Such a detector has been the subject matter of patent applications filed in Japan in 1983 by these inventors. The general configuration of such a detector can be seen in the cross-sectional view provided in FIG. 2, hereof. Unfortunately, such a radiation detector as that shown in FIG. 2 suffers from the problem that they have large electrostatic capacitance (which results in noise generated within the detector) and also suffer from the problem of the difficulty of coupling them to preamplifiers.

As a result, a very expensive pre-amplifier has been needed in the past to sufficiently detect the signal from a prior art radiation detector.

Therefore, it is an object of this invention to provide a semiconductor radiation detector which is free of the problems encountered with prior art semiconductor radiation detectors.

It is a further object of this invention to provide a semiconductor-based radiation detector which exhibits minimal electrostatic capacitance and, consequently, minimum thermal noise and minimum difficult in coupling an detector to a pre-amplifier.

SUMMARY OF THE INVENTION

In a semiconductor-based radiation detector comprising a semiconductor substrate and an amorphous semiconductor layer formed on one surface of the substrate, the electrode formed on the amorphous semiconductor layer consists of spaced but proximate conductive strips which are substantially uniformly arranged over the entire radiation-incident surface of the amorphous semiconductor layer. By so distributing the electrode, the electrostatic capacitance of the detector is significantly reduced without significantly changing the area of the detector that responds to radiation.

BRIEF DESCRIPTION OF THE DRAWINGS

This invention and its mode of operation can best be understood by reading the description which follows in conjunction with the drawings herein, in which.

DETAILED DESCRIPTION OF THE PREFERRED EMBODIMENT

Figure 1:
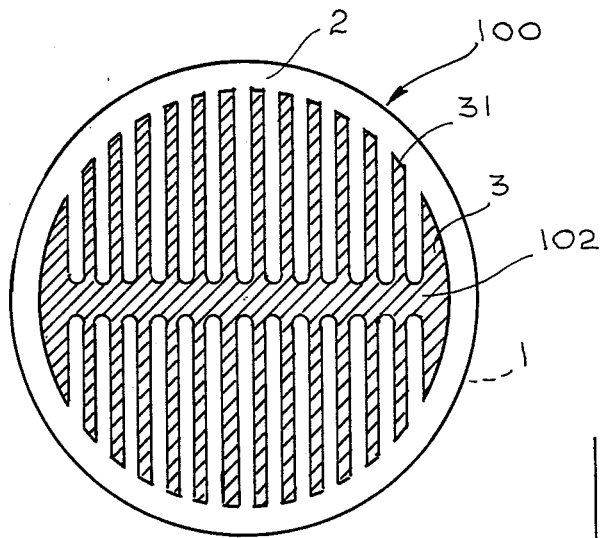
FIG. 1 is a plan view showing the electrode shape according to one embodiment of the present invention.
Figure 6:
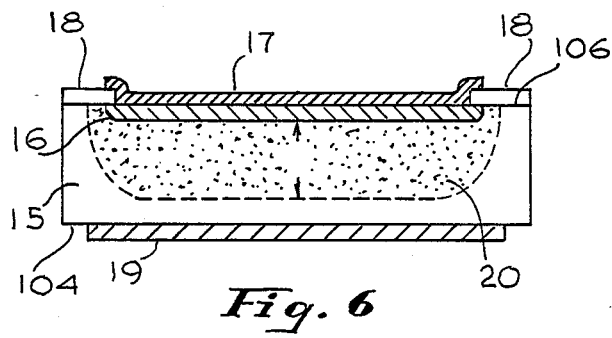
FIG. 6 is a cross-sectional view showing the depletion layer in a P-N diode.

In FIG. 1, semiconductor-based radiation detector 100 has a substrate 1 of single-crystal silicon, for example. An undoped amorphous silicon layer 2, to which hydrogen has been added is formed on substrate 1 by plasma techniques utilizing monosilane gas, for example. Because of the use of such plasma techniques the specific resistance of the layer 2 is 10 to 100 times greater than that of a layer formed by RF techniques. A metal electrode 32 having the shape indicated by the cross-hatching in FIG. 1 is then formed on amorphous layer 2 by vacuum evaporation using a metal mask. Purely by way of example, the silicon substrate 1 may have a diameter of 40 mm and the rib-electrode 3 is formed on the amorphous layer 2 within a circle having a diameter of 34 mm. Each strip-shaped portion 31 of the electrode 3 has a width of 1 mm, for example. These strip-shaped portions 31 may be spaced 2 mm from each other, for example. As can be seen in FIG. 1, the strip-shaped portions 31 emanate from a common trunk member 102. Experiments show that an electrode of this shape allows a depletion layer to spread through the substrate not only in the direction of the thickness but also toward the surface of the substrate when a voltage is applied. This phenomenon can be better understood by referring to FIG. 6, wherein there is shown a p-type semiconductor substrate 15 in which an n-type semiconductor region 16 exists. One surface of the substrate 15 is covered by an electrode 17 and a protective film 18 which are in contact with the n-type region 16. Another electrode 19 is formed on the opposite surface 104 of substrate 15. A reverse biasing voltage is applied to the p-n junction that is formed between the electrodes 17 and 19, resulting in a depletion layer 20. It is known that the width of this depletion layer 20 is given by the following equation: W (um)≃0.33×p×V, where p is the specific resistance in ohm-centimeters of the substrate and V is the applied voltage. Thus, a quantitative determination of the spread of the depletion layer in the direction of thickness of substrate 15 can be determined. However, that equation does not provide any quantitative consideration of the spread of the depletion layer towards the surface 106 of the substrate 15. Experiments conducted by the present inventors' using collimated alpha rays have shown that the depletion layer also spreads towards the surface 106 of substrate 15. Returning to FIG. 1, the configuration of electrode 3 has been designed to reflect the finding relative to the spreading of the depletion layer towards the surface of substrate 15. The rib-like pattern of electrode 3 takes advantage of the spreading phenomenon without the need to form an electrode substantially over the entire surface of the detector. A reduction of the actual area of electrode 3, of course, leads to a decrease in the electrostatic capacitance of semiconductor-based radiation detector 100.

Figure 7:
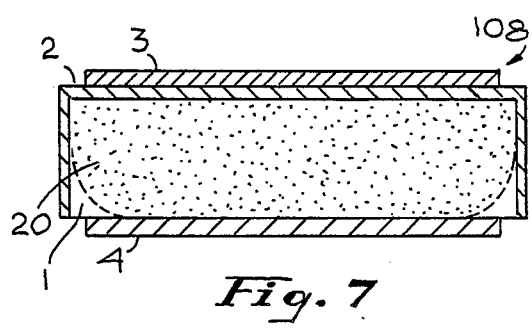
FIG. 7 is a cross-sectional view of the depletion layer in the semiconductor radiation detector of the prior art.
Figure 8:
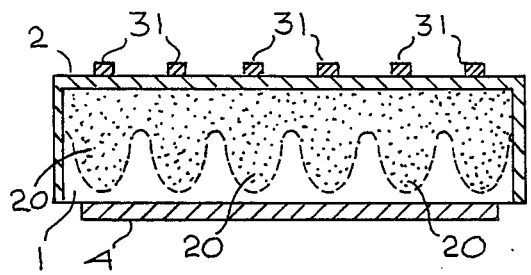
FIG. 8 is the conceptualization of the crosssection of the depletion layer in a semiconductor-based radiation detector according to this invention.

The positive effects of utilizing the electrode configuration according to this invention can be illustrated further by comparing the structures of FIG. 7 and FIG. 8. FIG. 7 shows a conventional semiconductor radiation detector like that shown in FIG. 2. Here parts correspond to parts shown in FIG. 2 have been given corresponding numbers. In the detectors of FIG. 7, a reverse bias may be applied to electrodes 3 and 4 to form the depletion layer 20. Strip-shaped electrodes 31 are distributed as shown in FIG. 8 and FIG. 1. When a reverse bias is applied between strip-shaped electrodes 31 and electrode 4, depletion layers 20 spread below electrode segments or rib-like elements 31 in the same manner as they spread in the radiation detector of FIG. 7. In addition, however, they spread towards the surface of substrate 1. Therefore, the depletion layers 20 are believed to spread into substrate 1 in the fashion illustrated in FIG. 8.

Figure 2:
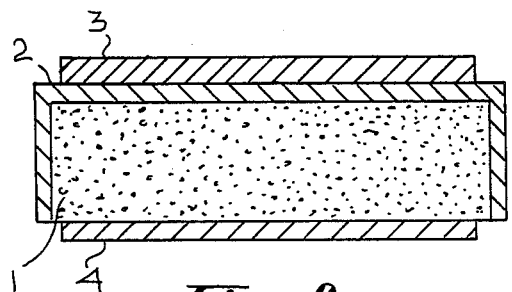
FIG. 2 is a cross-sectional view of a semiconductor-based radiation detector found in the prior art.

In the embodiment of FIGS. 1 and 8, the total area of the electrode pattern 3, i.e., with ribs 31 distributed over the surface of amorphous layer 2, the total area of the electrode pattern is 487 square millimeters, which is 0.54 times the area of the conventional electrode 3 shown in FIGS. 2 and 7. The electrostatic capacitance in the distributed electrode configurations of FIGS. 1 and 8 is about 200 picofarads, which is less than that of the conventional semiconductor radiation detector by about 100 picofarads. As a result, the noise level at 120 KeV as achieved in the device of this invention is less than the noise level at 80 KeV in the prior art devices.

Figure 9:
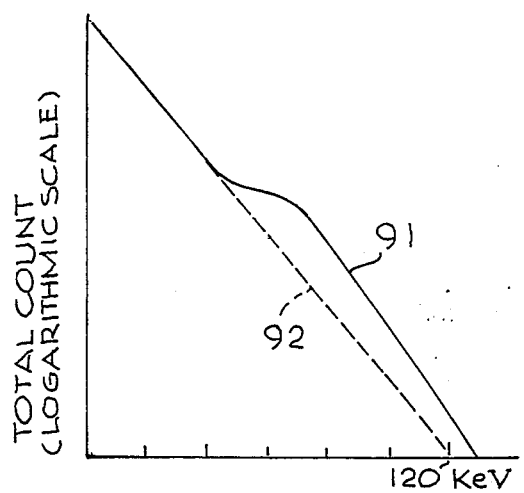
FIG. 9 is a graphical representation of the spectrum obtained with the present invention when detecting Americium (241), using the prior art device of FIG. 2.
Figure 10:
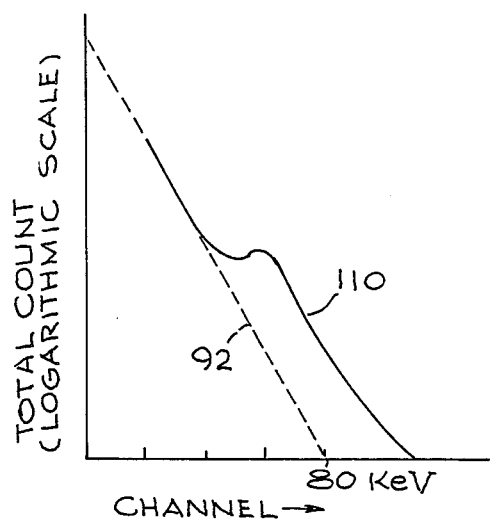
FIG. 10 is a graphical representation showing the spectrum obtained with a radiation detector according to the present invention when detecting Americium (241)

Returning to FIGS. 9 and 10, results obtained by actually detecting gamma radiation are indicated by solid lines 91 and 110, respectively. In these experiments, the gamma rays were produced from Americium (241). The results shown in FIG. 9 were derived by using the prior art structure shown in FIGS. 2 and 7. The noise level is high, as is indicated by broken line 92, so that the peak of Americium at 60 KeV cannot be seen clearly. In contrast, from the results shown in FIG. 10, utilizing the radiation detector according to this invention, the peak of Americium at 60 KeV is easily observed as the shoulder-like portion of the curve 110. Thus the semiconductor-based detector according to this invention, having a silicon wafer with the same area as that of the prior art devices, exhibits a reduced electrostatic capacitance and a reduced noise level. These characteristics make it easy to design a pre-amplifier, and contribute to a substantial reduction in the cost to manufacture the associated electrical circuit, such as that shown in FIG. 3.

Figure 4:
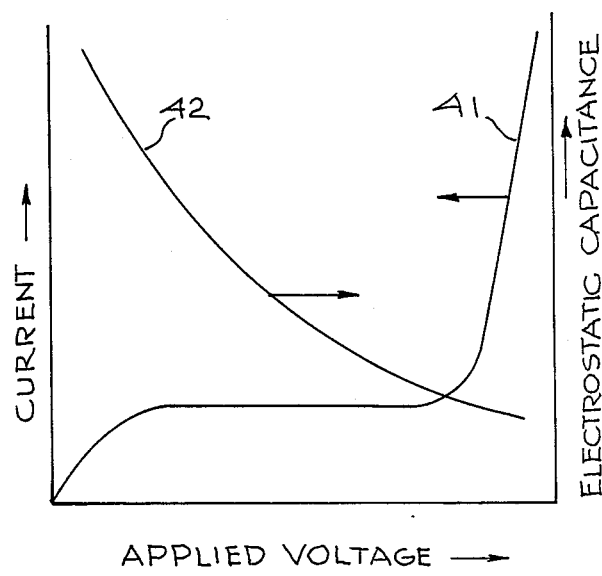
FIG. 4 is a graphical representation of the relationship between voltage applied to a semiconductor radiation detector and the leakage current at electrostatic capacitance which results from that voltage application.
Figure 3:
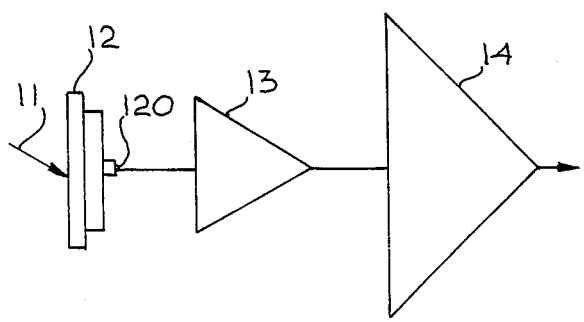
FIG. 3 is a block diagram of a semiconductor radiation detector and its associated amplifiers.
Figure 5:
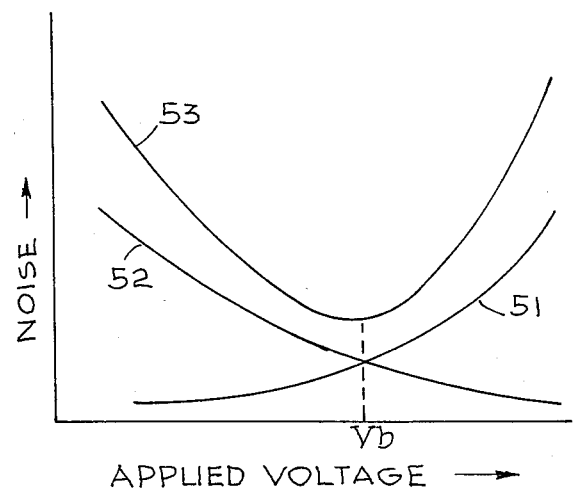
FIG. 5 is a graphical representation of the relationship between noise level and the voltage applied to a semiconductor radiation detector of the general class to which this invention relates.

In FIG. 3, when radiation 11 impinges on a semiconductor radiation detector 12, that detector produces a signal at its output terminal 120 which is fed to pre-amplifier 13. The output signal from pre-amplifier 13 is amplified to a usable level by power amplifier 14. One of the main causes of noise developed in a semiconductor radiation detector is an increase in the leakage current that arises from an increase in a reverse bias voltage which is applied for the purpose of broadening the depletion layer. Another cause is the large electrostatic capacitance of the conventional, prior art radiation detector device 12. This large capacitance makes it difficult to match preamplifier 13 to the radiation detector 12. Specifically, as can be seen from FIG. 4, as the applied voltage is increased, leakage current indicated by curve 41 increases, but the electrostatic capacitance indicated by curve 42 decreases. As a result, the applied voltage generates noise according to the curves in FIG. 4 and FIG. 5. Noise produced by the leakage current is indicated by curve 51. Noise attributable to the electrostatic capacitance is indicated by curve 52. The noise level 53, actually measured, reaches its minimum value when the applied voltage is Vb. Therefore, Vb is the optimum applied voltage.

Semiconductor-based radiation detectors from the prior art used in industrial instrumentation count the total number of radiation pulses, just as a Geiger-Mueller counter does, rather than obtaining any radiation spectra. Since such Geiger counter devices have only a small area, usually less than 4 square millimeters, the reverse leakage current is as small as 10 microamperes. Hence, the electrostatic capacitance is as small as a few picofarads, or less. This makes it easy to design the pre-amplifier for such detectors. On the other hand, as has been indicated, the semiconductor-based radiation detector, since it involves the depositing of an amorphous semiconductor layer on a semiconductor substrate, may easily be fabricated into a device of large area. The noise generated in such a radiation detector arises primarily from the large electrostatic capacitance. The subject invention reduces that electrostatic capacitance, significantly.

Figure 11:
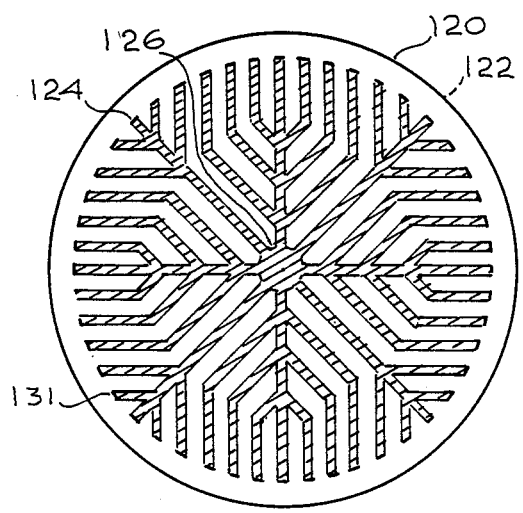
FIG. 11 is a plan view showing the shape of the electrode on the amorphous layer, according to a second embodiment of this invention; and, FIG. 12 is a graphical representation of the spectrum obtained utilizing the radiation detector according to the embodiment of FIG. 11 when detecting Americium (241).

In FIG. 11, there is presented an alternative embodiment of a semiconductor-based radiation detector according to this invention. In FIG. 11, an amorphous silicon layer 120 is deposited on the single crystal of silicon 122 by a plasma process. Then, an aluminum electrode 131 is deposited on the amorphous silicon 120 by vacuum evaporation, using a metal mask to produce the configuration shown in FIG. 11.

The electrode pattern 31 in FIG. 1 has a trunk member 102 running through its center. The electrode 124 in FIG. 11 has strips 131 extending in radial and associated directions from a common center region 126. The strips 131 are spaced about 2 mm. from each other, for example. The width of strips 131 may be as small as 0.4 mm. Accordingly, the total area of electrode 124 is 197 square millimeters, which is 0.22 times the electrode area of 907 square millimeters for the electrode 3 shown in FIGS. 2 and 7. The electrostatic capacitance in the embodiment of FIG. 11 is, therefore, about 140 picofarads, which is less than the capacitance of the prior art devices by about 160 pF. The resulting noise level is 60

Figure 12:
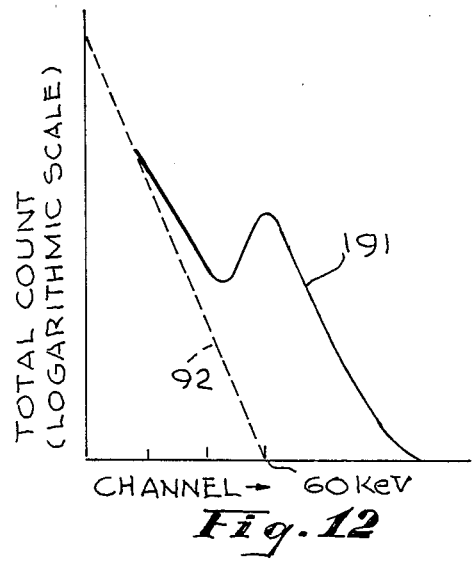

Kev, which is less than the 120 KeV noise level encountered in the prior art devices of FIGS. 2 and 7. As is shown in FIG. 12, the gamma-ray spectrum which has been obtained with the embodiment of FIG. 11 shows distinctly the peak for Americium (241) in curve 191. This is a very clear improvement in the performance of semiconductor-based radiation detectors.

Since the conventional prior art semiconductor radiation detectors had a large electrostatic capacitance, one pre-amplifier was installed for each detector. On the other hand, the capacitance of the embodiment of FIG. 11 is only 140 pF and so only one preamplifier is required for two detectors. Consequently, the number of pre-amplifiers used is cut in half and the cost of installing the radiation detection system is greatly reduced.

Thus, there has been provided a semiconductor-based radiation detector in which the electrostatic capacitance of the detector has been reduced without substantially changing the volume of the depletion layer of the detector and, hence, without reducing the sensitivity of the detector to radiation. There is a further reduction in the noise level of the detector. Consequently, the invention disclosed herein is particularly adaptable to large area semiconductor radiation detectors.

While particular embodiments of this invention have been shown and described, it will be apparent to those skilled in the art that modifications and variations may be made therein without departing from the spirit and scope of the invention. It is the intention of the appended claims to cover all such modifications and variations.

What is claimed is:

1. A semiconductor-based, non-solar radiation detector, including:
   a single-crystal substrate;
   an undoped amorphous silicon layer with high specific electrical resistance carried on at least one surface of said substrate to form a heterojunction therebetween;
   a first aluminum electrode carried on said amorphous silicon layer, said first aluminum electrode having a plurality of thin, closely and uniformly spaced, conductive straps of substantially constant width distributed substantially uniformly over the surface of said amorphous silicon layer and connected to a common central conductive element;
   a second electrode carried on a surface of said substrate opposite to a surface thereof carrying said undoped amorphous silicon layer; and,
   means, including said first and second electrodes, for applying a reverse bias to said heterojunction, whereby a depletion layer is produced in said substrate, which depletion layer produces electrical carrier when exposed to nonsolar radiation.

2. A device according to claim 1 which includes, in addition, an additional electrode carried by said silicon substrate on its surface opposite to that which carries said amorphous silicon layer, said additional electrode and said aluminum electrode being adapted for the application thereto of a biasing potential to produce a depletion layer in said single-crystal substrate.

3. A device according to claim 2 in which said single-crystal substrate is of silicon.

4. Apparatus according to claim 1 in which said central conductive element is a trunk from which said strips emanate.

5. Apparatus according to claim 1, in which said common central conductive element is a circular core.

6. Apparatus according to claim 1 in which the spaces between adjacent ones of said conductive strips are equal and constant over the length of the strips.

* * * * *